(12) United States Patent
Yamada et al.

(10) Patent No.: US 11,806,753 B2
(45) Date of Patent: Nov. 7, 2023

(54) ULTRASONIC DEVICE AND MANUFACTURING METHOD OF ULTRASONIC DEVICE

(71) Applicant: SEIKO EPSON CORPORATION, Tokyo (JP)

(72) Inventors: Masayoshi Yamada, Nagano (JP); Hikaru Iwai, Nagano (JP); Mitsuru Miyasaka, Nagano (JP); Yoshio Arai, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 310 days.

(21) Appl. No.: 17/038,632

(22) Filed: Sep. 30, 2020

(65) Prior Publication Data

US 2021/0094071 A1    Apr. 1, 2021

(30) Foreign Application Priority Data

Sep. 30, 2019  (JP) .................. 2019-179223

(51) Int. Cl.
| | |
|---|---|
| *B06B 1/06* | (2006.01) |
| *B06B 1/02* | (2006.01) |
| *H10N 30/02* | (2023.01) |
| *H10N 30/06* | (2023.01) |
| *H10N 30/88* | (2023.01) |
| *H10N 30/80* | (2023.01) |
| *H10N 30/87* | (2023.01) |

(52) U.S. Cl.
CPC .......... *B06B 1/0644* (2013.01); *B06B 1/0215* (2013.01); *H10N 30/02* (2023.02); *H10N 30/06* (2023.02); *H10N 30/802* (2023.02); *H10N 30/875* (2023.02); *H10N 30/88* (2023.02)

(58) Field of Classification Search
CPC .... B06B 1/0644; H10N 30/875; H10N 30/88; H01L 41/0475; H01L 41/053
See application file for complete search history.

(56) References Cited

U.S. PATENT DOCUMENTS

| | | | |
|---|---|---|---|
| 5,376,860 A * | 12/1994 | Sato | G01L 23/222 310/346 |
| 2006/0241467 A1* | 10/2006 | Takeda | G10K 9/18 600/459 |
| 2011/0290028 A1* | 12/2011 | Matsumoto | G10K 9/122 73/658 |
| 2016/0207153 A1* | 7/2016 | Birtcher | G01F 23/2965 |

(Continued)

FOREIGN PATENT DOCUMENTS

| | | |
|---|---|---|
| GB | 1490690 A | 11/1977 |
| JP | H1050416 A | 2/1998 |

(Continued)

*Primary Examiner* — Bryan P Gordon
(74) *Attorney, Agent, or Firm* — CHIP LAW GROUP

(57) ABSTRACT

An ultrasonic device includes an ultrasonic sensor, a wiring member, and a housing, in which the wiring member has a covered wire that covers a signal line coupled to the ultrasonic sensor via an insulating layer, and a conductive member that is electrically coupled with the covered wire, the housing has a plurality of housing components having conductivity, and covers the ultrasonic sensor with the plurality of housing components, and the conductive member is electrically coupled to and held by the plurality of housing components.

4 Claims, 13 Drawing Sheets

(56) References Cited

U.S. PATENT DOCUMENTS

2018/0182949 A1* 6/2018 Kojima ............ H10N 30/10513
2019/0115522 A1* 4/2019 Wong .................... H10N 30/88

FOREIGN PATENT DOCUMENTS

| JP | 2009049660 A | 3/2009 |
| JP | 2010118957 A | 5/2010 |
| WO | 2019087967 A1 | 5/2019 |

* cited by examiner

ULTRASONIC DEVICE AND MANUFACTURING METHOD OF ULTRASONIC DEVICE

The present application is based on, and claims priority from JP Application Serial Number 2019-179223, filed Sep. 30, 2019, the disclosure of which is hereby incorporated by reference herein in its entirety.

BACKGROUND

1. Technical Field

The present disclosure relates to an ultrasonic device and a manufacturing method of an ultrasonic device.

2. Related Art

In related art, in a short-distance sensor that measures a distance to an object, a double-feed detection sensor that detects a double-feed of an object, and the like, an ultrasonic device that transmits ultrasonic waves to the object and receives ultrasonic waves reflected by the object or ultrasonic waves that pass through the object may be used.

Such an ultrasonic device can have a simple configuration in which a vibration element such as a piezoelectric element is disposed on an element substrate having a vibration portion, for example, and the ultrasonic device can be downsized. On the other hand, when such a small ultrasonic device couples a circuit board, since a housing of the ultrasonic device is small, it is difficult to forma connector terminal for coupling a connector to the housing.

In addition, in order to reduce influence of electromagnetic waves from an outside, in addition to a wiring to the element substrate, the ultrasonic device needs to be coupled to a ground line that maintains an exterior housing of the ultrasonic device at a reference potential.

JP-A-10-50416 shows a coupling example between the connector and the wiring, which is a coupling configuration for coupling the wiring to a small device such as the ultrasonic device. In JP-A-10-50416, a cable including a plurality of covered conductors and a shield covering layer that covers these covered conductors is coupled to the connector. At this time, the shield covering layer is exposed and disposed on a ring-shaped gasket, the ring-shaped gasket is electrically conducted to the housing, and a cable clamp is screwed to fix the cable to the housing. After this, the covered conductor is soldered to the connector terminal, and then the housing is assembled.

However, in the cable coupling configuration described in JP-A-10-50416, a step of fixing the cable to the housing, a step of bringing the shield covering layer into conduction with the housing, a step of coupling the covered conductor by soldering, and a step of assembling the housing need to be performed, and therefore, manufacture efficiency is low. That is, when the wiring coupling configuration as described in JP-A-10-50416 is used for the cable coupling configuration to the ultrasonic device, there is a problem that the manufacture efficiency of the ultrasonic device is reduced.

SUMMARY

An ultrasonic device according to a first application example includes: an ultrasonic sensor; a wiring member; and a housing, in which the wiring member has a covered wire that covers a signal line coupled to the ultrasonic sensor via an insulating layer, and a conductive member that is electrically coupled with the covered wire, the housing has a plurality of housing components having conductivity, and covers the ultrasonic sensor with the plurality of housing components, and the conductive member is electrically coupled to and held by the plurality of housing components.

In the ultrasonic device according to the first application example, one of the housing and the conductive member may have a convex portion that protrudes toward the other of the housing and the conductive member, and the convex portion may be coupled to the other of the housing and the conductive member.

In the ultrasonic device according to the first application example, one of the housing and the conductive member may be made of a metal at a coupling portion between the housing and the conductive member.

In the ultrasonic device according to the first application example, the conductive member has a tubular shape with a central axis along a line direction of the wiring member, and a tube outer peripheral diameter dimension of the coupling portion between the housing and the conductive member may be smaller than a tube outer peripheral diameter dimension of a portion other than the coupling portion of the conductive member.

A manufacturing method of an ultrasonic device according to a second application example is a manufacturing method of an ultrasonic device including an ultrasonic sensor; a wiring member having a signal line coupled to the ultrasonic sensor and a covered wire covering the signal line via an insulating layer, in which the signal line is inserted into one end side of the wiring member, and a conductive member electrically conducting with the covered wire is provided; and a housing covering the ultrasonic sensor and including a plurality of housing components having conductivity. The manufacturing method includes: a coupling step of coupling the signal line to the ultrasonic sensor; and a housing assembling step of assembling the housing by holding the conductive member of the wiring member with the plurality of housing components.

In the manufacturing method of an ultrasonic device according to the second application example, one of the housing and the conductive member may have a convex portion that protrudes toward the other of the housing and the conductive member, and in the housing assembling step, the convex portion may be coupled to the other of the housing and the conductive member.

In the manufacturing method of an ultrasonic device according to the second application example, in the housing assembling step, the conductive member may be pressed and deformed by the plurality of housing components.

DESCRIPTION OF EXEMPLARY EMBODIMENTS

First Embodiment

Hereinafter, the first embodiment will be described.

Figure 1:
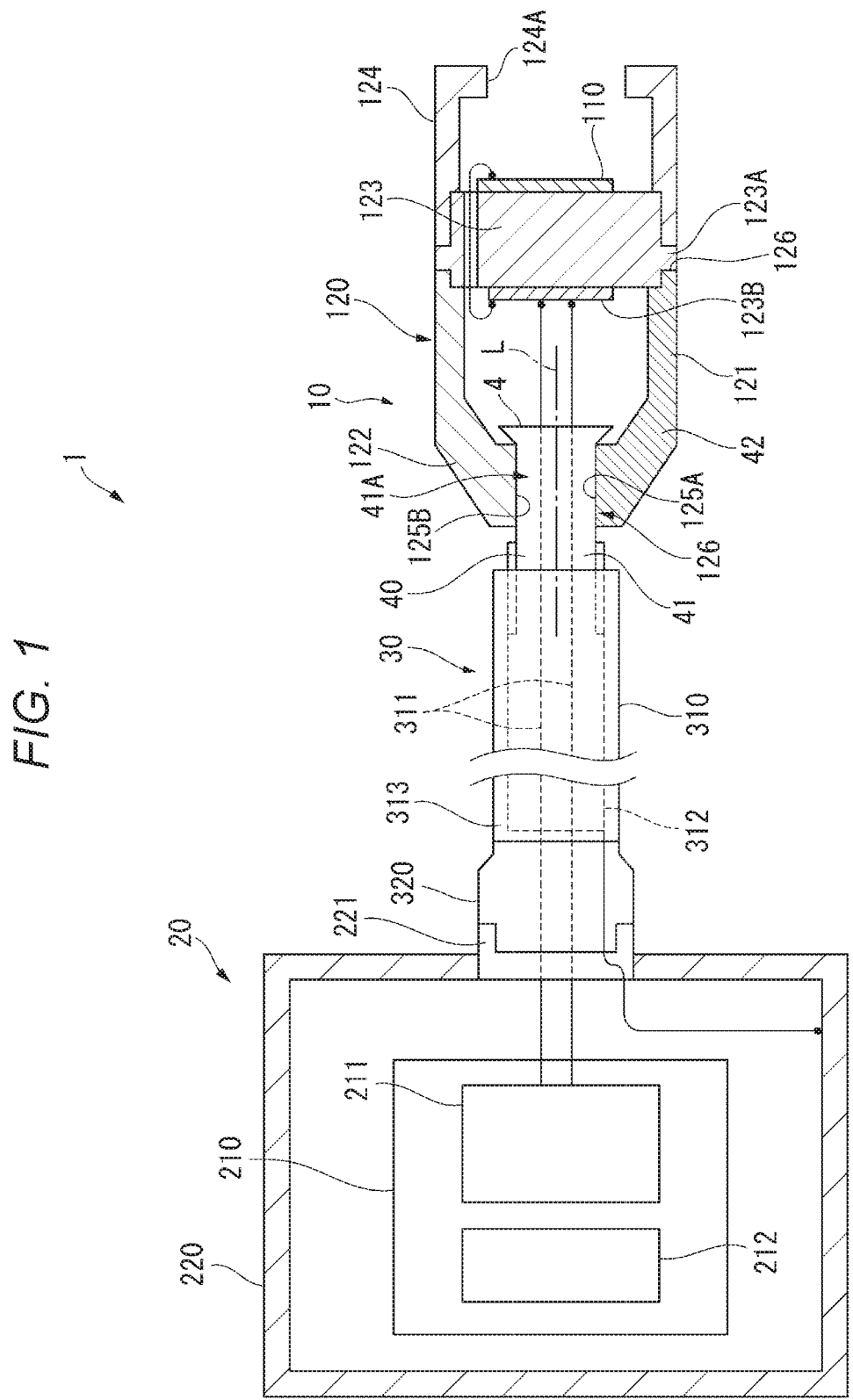
FIG. 1 is a schematic diagram showing a schematic configuration of an ultrasonic device according to a first embodiment.

FIG. 1 is a schematic diagram showing a schematic configuration of an ultrasonic device 1 according to the first embodiment.

In FIG. 1, the ultrasonic device 1 includes an ultrasonic module 10, a device body 20, and a wiring member 30 that couples the ultrasonic module 10 and the device body 20.

Examples of the ultrasonic device 1 can include a robot arm, a printing device, an image reading device and the like. When the ultrasonic device 1 is used as a robot arm, for example, the ultrasonic module 10 transmits ultrasonic waves to an object (not shown) and receives ultrasonic waves reflected by the object. Then, a distance from the ultrasonic module 10 to the object is calculated based on a time from a transmission timing of the ultrasonic waves to a reception timing, and a sound speed. Thereby, the robot arm can perform a predetermined processing on the object based on the calculated distance.

Further, when the ultrasonic device 1 is used as the printing device or the image reading device, the ultrasonic module 10 transmits the ultrasonic waves to the object such as a paper surface, ultrasonic waves reflected by the object are received by the ultrasonic module 10, and a sound pressure of the ultrasonic waves is measured. Therefore, a thickness of the object and a double feed of the object can be detected.

Hereinafter, such an ultrasonic device 1 will be described in detail.
Configuration of Ultrasonic Module 10

As shown in FIG. 1, the ultrasonic module 10 includes an ultrasonic sensor 110, and a housing 120 in which the ultrasonic sensor 110 is stored.

Figure 2:
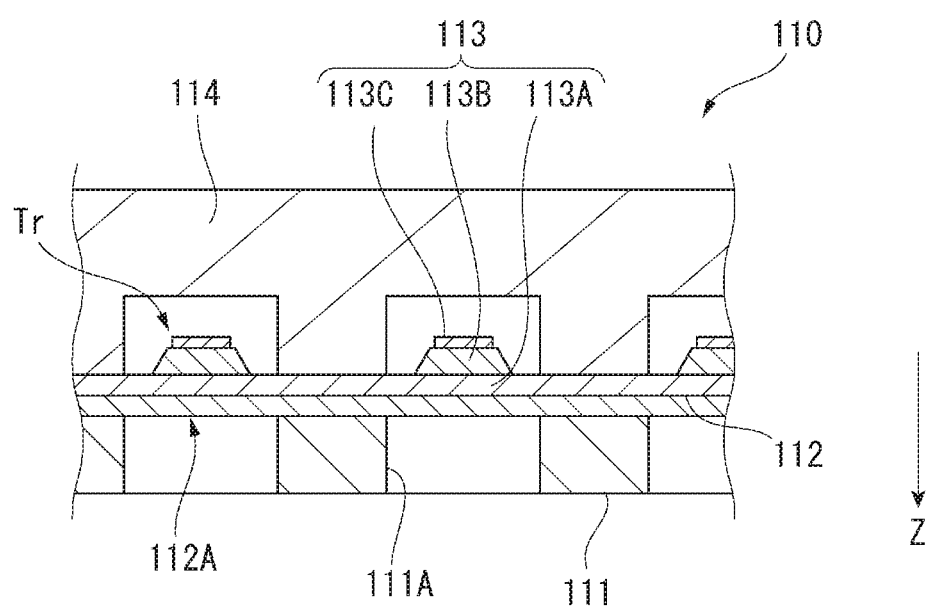
FIG. 2 is a sectional view showing an ultrasonic sensor according to the first embodiment.

FIG. 2 is a sectional view showing a schematic configuration of the ultrasonic sensor 110.

As shown in FIG. 2, the ultrasonic sensor 110 includes a substrate 111, a vibration plate 112, a piezoelectric element 113, and a protective member 114.

The substrate 111 is a semiconductor substrate made of, for example, Si or the like, and has a plurality of opening portions 111A penetrating in a Z direction which is a transmission direction of the ultrasonic waves.

The vibration plate 112 is stacked on the substrate 111 and closes the opening portions 111A. A portion of the vibration plate 112, which overlaps the opening portions 111A when viewed from the Z direction, constitutes a vibration portion 112A.

The piezoelectric element 113 is provided on each vibration portion 112A. The piezoelectric element 113 is configured with a stacked body of a lower electrode 113A, a piezoelectric film 113B, and an upper electrode 113C. Further, the lower electrode 113A and the upper electrode 113C are coupled to wiring electrodes extending to a predetermined terminal area on the vibration plate 112.

The protective member 114 is a substrate that protects the substrate 111, the vibration plate 112, and the piezoelectric element 113, and is joined to the vibration plate 112 on a side opposite to the substrate 111, for example.

In such an ultrasonic sensor 110, one ultrasonic transducer is configured with one vibration portion 112A and the piezoelectric element 113 disposed on the vibration portion 112A. Further, in the present embodiment, one of the lower electrode 113A and the upper electrode 113C of an ultrasonic transducer Tr is a drive electrode while another is a common electrode, and the common electrode is maintained at a predetermined reference potential. Then, in each ultrasonic transducer Tr, a drive pulse signal is input to the drive electrode, such that the piezoelectric element 113 is deformed and the vibration portion 112A vibrates. Accordingly, the ultrasonic transducer Tr transmits the ultrasonic wave in the Z direction from the vibration portion 112A. Further, when the ultrasonic wave is input from the opening portion 111A, the vibration portion 112A vibrates according to a sound pressure of the ultrasonic wave. The piezoelectric film 113B is deformed due to the vibration of the vibration portion 112A, and a potential difference is generated between the lower electrode 113A and the upper electrode 113C. Accordingly, a reception signal according to the sound pressure of the received ultrasonic wave is output from the drive electrode of the ultrasonic transducer Tr. That is, reception of the ultrasonic wave is detected.

Note that the ultrasonic sensor 110 shown in FIG. 2 exemplifies a so-called pMUT type ultrasonic transducer in which the piezoelectric element 113 is disposed on the vibration portion 112A, but the ultrasonic sensor 110 is not limited to this. For example, a so-called cMUT type ultrasonic sensor, in which a vibration plate and a substrate facing the vibration plate are provided, electrodes are separately disposed on these substrates, and the vibration plate is vibrated by applying a periodic drive voltage between the electrodes, may be used as the ultrasonic sensor 110. Further, the ultrasonic sensor 110 may be an ultrasonic sensor in which an electrode is coupled to a bulk type piezoelectric body and the piezoelectric body is directly vibrated by energization to transmit an ultrasonic wave.

Figure 3:
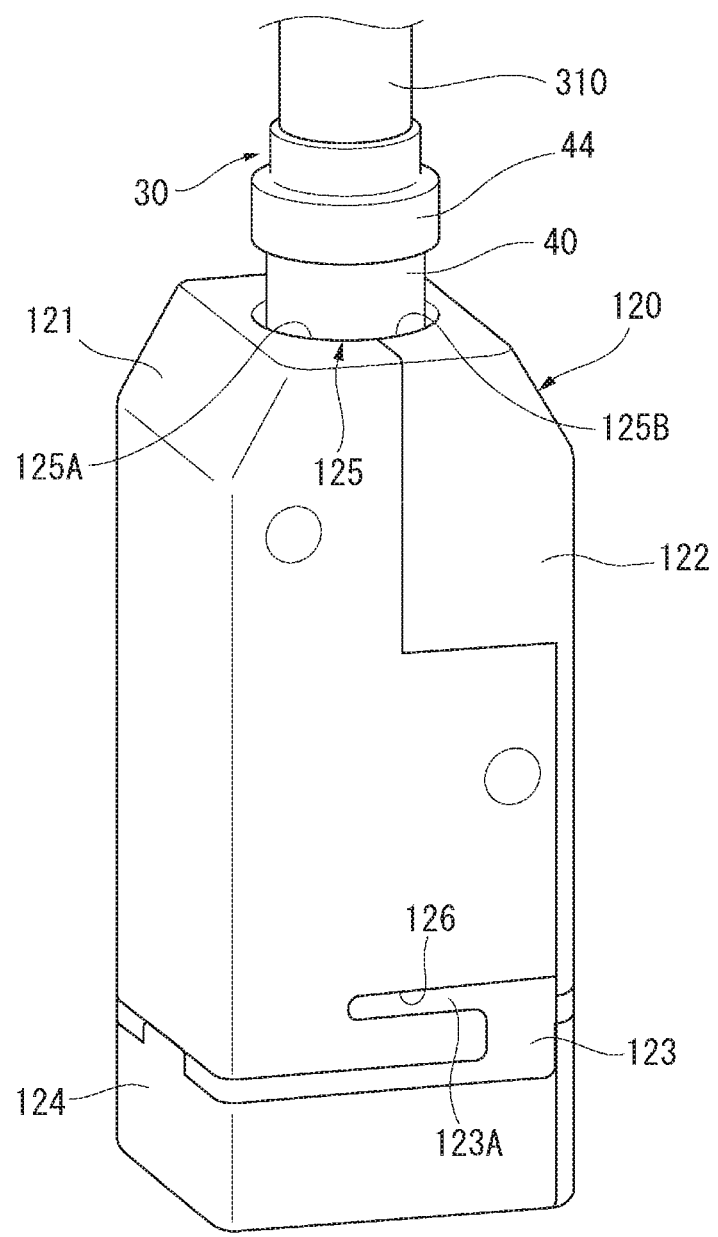
FIG. 3 is a perspective view showing an external appearance of an ultrasonic module according to the first embodiment.

FIG. 3 is a perspective view showing an external appearance of the ultrasonic module 10.

The housing 120 is configured with a plurality of housing components. For example, in the present embodiment, as shown in FIGS. 1 and 3, the housing 120 is configured by combining a first housing component 121, a second housing component 122, a sensor fixing portion 123, and a window frame portion 124.

Further, the housing 120 includes a wiring hole 125 through which the wiring member 30 that couples the device body 20 and the ultrasonic module 10 is inserted. The wiring hole 125 is configured with a first recess portion 125A provided in the first housing component 121, and a second recess portion 125B provided in the second housing component 122.

An axis passing through a center of the wiring hole 125 and orthogonal to an opening surface of the wiring hole 125 is taken as a central axis L, and the first recess portion 125A and the second recess portion 125B have a semicircular sectional shape when being cut along a plane orthogonal to the central axis L. The inner peripheral cylindrical wiring hole 125 is formed by facing opening ends of the first recess portion 125A and the second recess portion 125B to each other.

Then, in the present embodiment, a conductive ring 40 of the wiring member 30, which will be described later, is held between the first recess portion 125A and the second recess portion 125B.

The description related to the wiring member 30 and the coupling between the conductive ring 40 and the housing 120 will be given later.

Further, in the housing 120, an inner peripheral surface of the wiring hole 125, and at least one of an inner surface and an outer surface of the housing 120 have conductivity, and the inner peripheral surface of the wiring hole having conductivity and at least one of the inner surface and the outer surface of the housing 120 are coupled to each other. For example, when the first housing component 121 and the second housing component 122 are made of a resin, a conductive layer may be formed over an entire surface, or a conductive layer may be formed over the wiring hole 125 from either the inner surface or the outer surface of the housing 120. Further, the housing 120 may be made of a metal. When the first housing component 121 and the second housing component 122 are made of a metal and coating is applied to the surface, coating of the first recess portion 125A and the second recess portion 125B forming the inner peripheral surface of the wiring hole 125 is removed to expose the metal. In the present embodiment, the housing 120 is made of the resin, and the conductive layer such as a metal film is formed at the surface of the housing 120, which are shown as an example.

The sensor fixing portion 123 is fixed to, for example, the first housing component 121. The sensor fixing portion 123 may be integrally formed with the first housing component 121.

For example, in the present embodiment, as shown in FIG. 3, at an end portion of the first housing component 121 provided on a side opposite to the side where the first recess portion 125A is provided, a notch portion 126 having an open surface facing the second housing component 122 is provided. In addition, the sensor fixing portion 123 includes a fixing piece 123A that can be engaged with the notch portion 126. Then, the sensor fixing portion 123 is fixed by engaging the fixing piece 123A with the notch portion 126.

The window frame portion 124 is fixed to a side of the sensor fixing portion 123 opposite to the first housing component 121.

The sensor fixing portion 123 has a sensor fixing surface facing the window frame portion 124 and fixing the ultrasonic sensor 110, and the ultrasonic sensor 110 is fixed to the sensor fixing surface.

A connection circuit board 123B is provided on a surface of the sensor fixing portion 123 opposite to the sensor fixing surface. This connection circuit board 123B is coupled to the wiring electrodes of the ultrasonic sensor 110 by, for example, an FPC, and electrode pads corresponding to the wiring electrodes coupled to the lower electrodes 113A and electrode pads corresponding to the wiring electrodes coupled to the upper electrodes 113C are respectively provided. In the present embodiment, an example in which a signal line 311 of the wiring member 30 described later is fixed to the connection circuit board 123B by soldering is shown, but the disclosure is not limited to this. For example, by engaging a small female socket coupled to each wiring electrode of the ultrasonic sensor 110 and a small male socket coupled to a tip end of the signal line 311, the ultrasonic sensor 110 and the signal line 311 may be electrically coupled.

The window frame portion 124 is a frame-shaped member fixed to the sensor fixing portion 123. The window frame portion 124, as shown in FIG. 1, includes a window portion 124A through which the ultrasonic waves transmitted and received by the ultrasonic sensor 110 pass.

Configuration of Device Body 20

The device body 20 includes a circuit board 210 and a device housing 220 that accommodates the circuit board 210.

The circuit board 210 includes a circuit that controls the entire ultrasonic device 1, and a circuit that controls the ultrasonic module 10.

As the circuit that controls the ultrasonic module 10, as shown in FIG. 1, a transmission and reception circuit 211, a measurement control circuit 212 and the like are included.

The transmission and reception circuit 211 includes a transmission circuit that generates a drive pulse for transmitting the ultrasonic waves from the ultrasonic sensor 110, a reception circuit that processes a reception signal input from the ultrasonic sensor 110, a signal ground that maintains the common electrode at the predetermined reference potential, and the like.

The measurement control circuit 212 calculates a measurement result based on an ultrasonic transmission and reception result. For example, when the ultrasonic device 1 is a robot device and the ultrasonic module 10 is used as a short-range sensor, the distance from the ultrasonic module 10 to the object is calculated based on the time from the transmission timing of the ultrasonic waves to the reception timing of the ultrasonic waves and the sound speed.

The device housing 220 is a housing having conductivity and is maintained at a ground potential by a frame ground. The device housing 220 may be made of, for example, a metal, or may be made of a non-conductive material such as plastic, and may be formed by forming a conductive film on a surface thereof.

Further, the device housing 220 includes a female connector 221 coupled to the transmission and reception circuit 211 of the circuit board 210. The female connector 221 is provided such that a male connector 320 of the wiring member 30 can be inserted therethrough, and includes a plurality of signal sockets, common sockets, ground sockets, and the like (not shown). Then, the signal sockets and the common sockets are electrically coupled to the transmission and reception circuit 211 of the circuit board 210 by a lead wire, the FPC or the like. The ground socket is coupled to the device housing 220 by the lead wire or the like. The ground socket and the device housing 220 may be coupled via a capacitor, and in this case, influence of electromagnetic waves from an outside can be prevented more effectively.

Configuration of Wiring Member 30

Figure 4:
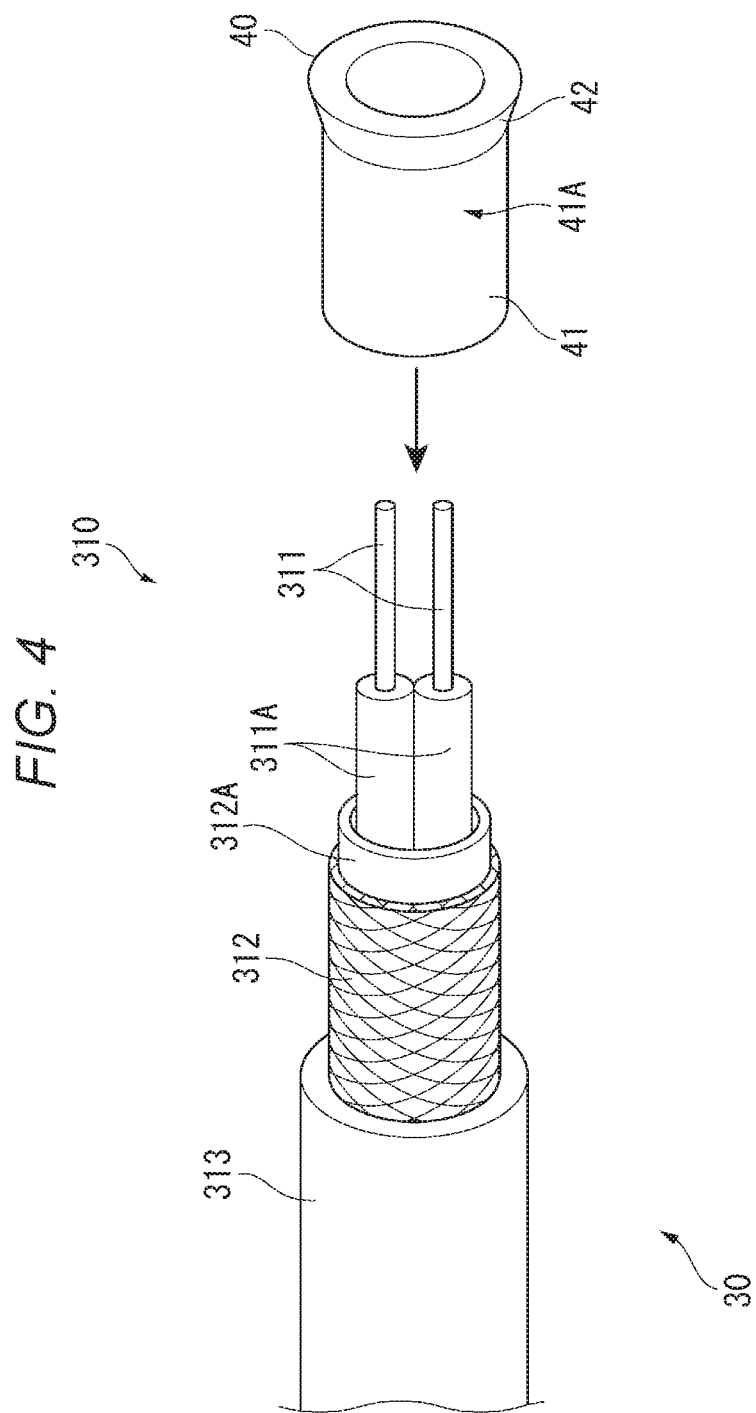
FIG. 4 is a diagram showing a schematic configuration of a wiring member according to the first embodiment.

FIG. 4 is a diagram showing a schematic configuration of the wiring member 30.

The wiring member 30 is a wiring that couples the ultrasonic module 10 and the device body 20. The wiring member 30 includes a cable line 310, the male connector 320 (see FIG. 1) provided on one end side of the cable line 310, and the conductive ring 40 provided on another end side of the cable line 310.

The cable line 310 includes a plurality of signal lines 311, a covered wire 312, and an exterior portion 313.

The signal line 311 is a line that transmits a signal between the circuit board 210 and the ultrasonic sensor 110. The signal line 311 includes a drive line coupled to the drive electrode, and a common line coupled to the common electrode. In the ultrasonic sensor 110, when a plurality of ultrasonic transducers are divided into a plurality of channels and each of the channels is driven independently, as many drive lines as the number of the channels are provided.

Each signal line 311 is covered with an insulating layer 311A to prevent disconnection of the signal line 311 and short circuit with another signal line 311. Note that, as shown in FIG. 4, the plurality of signal lines 311 may be put together and inserted into a tube 312A of an insulator.

The plurality of signal lines 311 are disposed along a central axis of the cable line 310, and the covered wire 312 is disposed so as to surround these signal lines 311.

The covered wire 312 is a shield covered layer made of, for example, a braided wire in which copper wires are braided. Since the signal line 311 is covered with the insulating layer 311A which is the insulator, there is no short circuit between the signal line 311 and the covered wire 312. When the signal line 311 is inserted through the tube 312A, the covered wire 312 may be provided so as to surround an outer circumference of the tube 312A.

The covered wire 312 is conducted to the conductive ring 40 described later.

The exterior portion 313 is an insulating tube that covers the outer circumference of the covered wire 312.

As shown in FIG. 1, the male connector 320 is a connector that can be inserted into the female connector 221 of the device body 20. This male connector 320 includes a signal pin (not shown) to which the drive line of the signal line 311 is coupled, a common pin (not shown) to which the common line of the signal line 311 is coupled, and a ground pin (not shown) to which the covered wire 312 is coupled. By inserting the male connector 320 into the female connector 221, the signal pin is inserted and coupled to the signal socket, the common pin is inserted and coupled to the common socket, and the ground pin is inserted and coupled to the ground socket. Here, an example in which the female connector 221 is provided on the device housing 220 and the wiring member 30 includes the male connector 320 is shown, but the male connector may be provided on the device housing, and the female connector may be provided on the wiring member 30.

The conductive ring 40 is a conductive member provided on one end side of the wiring member 30 close to the ultrasonic module 10, and as shown in FIG. 1, FIG. 3, and FIG. 4, the conductive ring 40 is formed in a tubular shape having a central axis along a line direction of the cable line 310.

Specifically, the conductive ring includes a body portion 41 having a constant diameter dimension of a tube outer peripheral surface, and a large diameter portion 42 that is coupled to one end side of the body portion 41 and has a larger diameter dimension of an outer peripheral surface than that of the body portion 41.

The body portion 41 has a coupling portion 41A held by the first recess portion 125A and the second recess portion 125B of the housing 120. By being held between the first recess portion 125A and the second recess portion 125B, the coupling portion 41A abuts against an inner circumference surface of the wiring hole 125 constituted by the first recess portion 125A and the second recess portion 125B.

The large diameter portion 42 is disposed inside the housing 120 when the coupling portion 41A is held between the first housing component 121 and the second housing component 122.

As shown in FIG. 4, the large diameter portion 42 may be formed in a taper shape in which the diameter dimension of the outer peripheral surface gradually increases with as the large diameter portion 42 separates from the body portion 41, and may be formed in a wall shape with a right angle being formed with respect to a peripheral surface of the body portion 41.

By providing the large diameter portion 42, for example, when the cable line 310 is pulled, inconvenience of the conductive ring 40 falling out of the housing 120 can be prevented, and the disconnection of the signal line 311 can be prevented.

Then, the conductive ring 40 is made of at least a member whose tube outer peripheral surface is conductive. For example, the conductive ring 40 may be made of a metal or a resin, and a conductive film may be formed at a surface of the resin. In the present embodiment, an example in which the conductive ring 40 is made of a metal is shown.

Then, the conductive ring 40 is inserted into the wiring hole 125 of the housing 120 as described above. At this time, the conductive ring 40 is held between the first recess portion 125A of the first housing component 121 and the second recess portion 125B of the second housing component 122, and is pressed in a direction from the first housing component 121 toward the second housing component 122. As a result, the conductive ring 40 is fixed to the housing 120, and meanwhile an outer peripheral surface (metal) of the conductive ring 40 comes into contact with conductive layers formed at the surfaces of the first housing component 121 and the second housing component 122, so as to be electrically conducted. In the following description, a portion of the conductive ring 40 that contacts the wiring hole 125 will be referred to as the coupling portion 41A.

Figure 5:
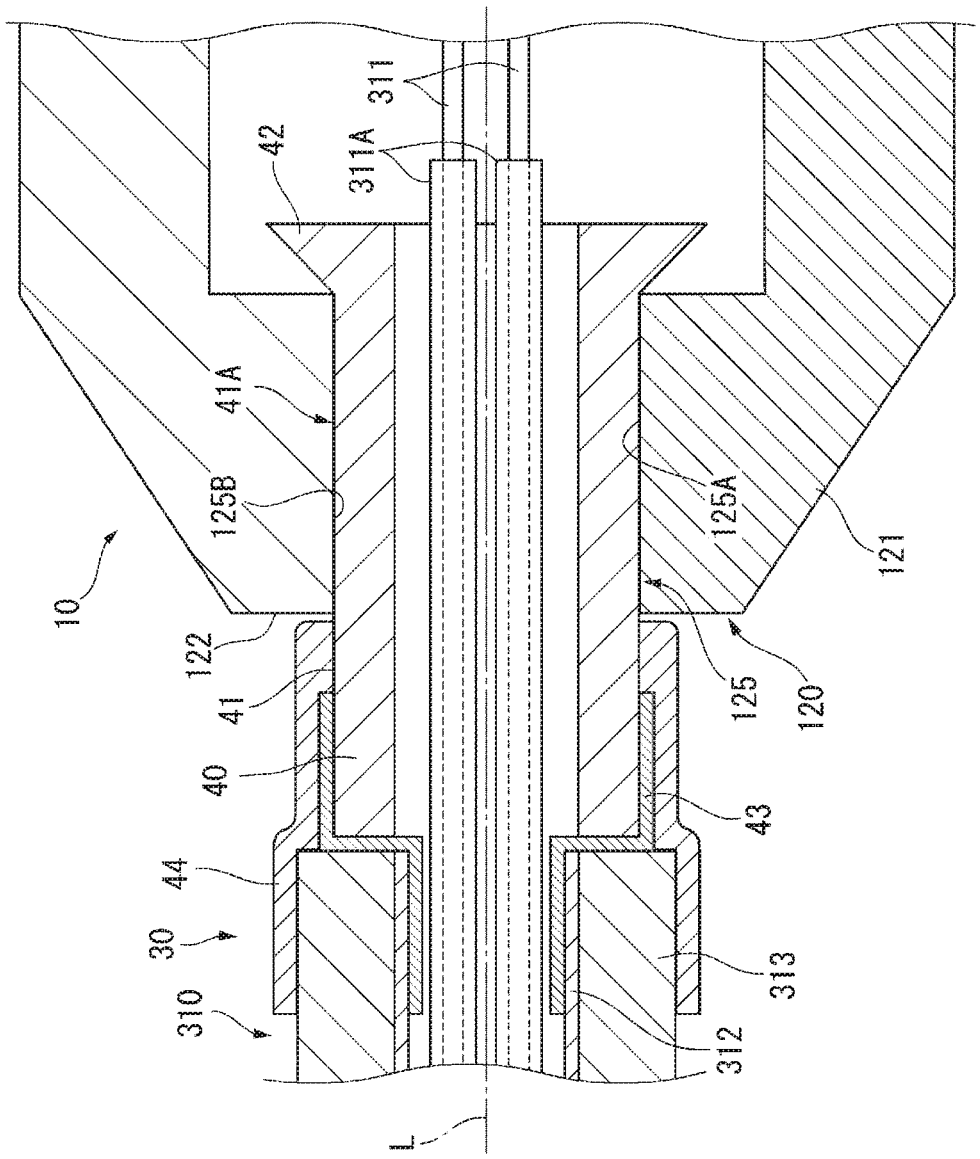
FIG. 5 is an enlarged sectional view showing a structure for fixing a conductive ring to a housing in the first embodiment.

FIG. 5 is an enlarged sectional view showing a structure for fixing the conductive ring 40 to the housing 120.

Then, in the present embodiment, the signal lines 311 are inserted through the conductive ring 40, and the covered wire 312 is coupled to the conductive ring 40.

That is, at an attachment position of the conductive ring 40 of the wiring member 30, the exterior portion 313 and the covered wire 312 are removed, and only the signal lines 311 are inserted into the conductive ring 40. Then, in the present embodiment, as shown in FIG. 5, one end of a tubular conductive tape 43 coaxial with the cable line 310 is inserted between the signal lines 311 and the covered wire 312 of the cable line 310, such that the conductive tape 43 contacts the covered wire 312 to be fixed. The other end of the conductive tape 43 is coupled to an outer peripheral surface of the conductive ring 40. As shown in FIG. 5, a winding member 44 such as a tape is wound around a boundary between the conductive tape 43 and the exterior portion 313, and the conductive tape 43 is tightened and fixed to the conductive ring 40. In this case, inconvenience that the cable line 310 comes off the conductive ring 40 can be prevented.

As described above, in the present embodiment, the conductive ring 40 and the covered wire 312 are electrically coupled, and the covered wire 312 is electrically coupled to the device housing 220 via the male connector 320 and the female connector 221. Therefore, the entire ultrasonic module 10 from the device housing 220, through the covered wire 312, to the housing 120 is maintained at the ground potential. As a result, all of the ultrasonic sensor 110, the signal line 311, and the circuit board 210 are protected from the electromagnetic waves from the outside.

Manufacturing Method of Ultrasonic Module 10

Next, the manufacturing method of the ultrasonic module 10, specifically, a method of assembling the ultrasonic module 10 by coupling the cable line 310 to the ultrasonic sensor 110 and accommodating the same in the housing 120 will be described.

In order to manufacture the ultrasonic module 10, firstly, a wiring preparation step of preparing the wiring member 30 in advance is implemented.

Specifically, the metallic conductive ring 40 is formed.

Next, the exterior portion 313 and the covered wire 312 are removed from a tip end portion of the cable line 310 on the ultrasonic module 10 side to expose the signal lines 311.

Then, the signal lines 311 at the tip end of the cable line 310 on the side of the ultrasonic module 10 are inserted into the conductive ring 40, and the conductive ring 40 is fixed to the cable line 310 to form the wiring member 30. Specifically, as described above, one end of the conductive tape 43 is inserted between the signal lines 311 and the covered wire 312 of the cable line 310. Further, the signal lines 311 are inserted into a tube of the conductive ring 40, and the conductive ring 40 is moved to a position where an end surface of the conductive ring 40 contacts an end surface of the exterior portion 313. Then, the other end of the conductive tape 43 comes into contact with the outer peripheral surface of the conductive ring 40 and is fixed by the winding member 44 such as a tape.

Figure 6:
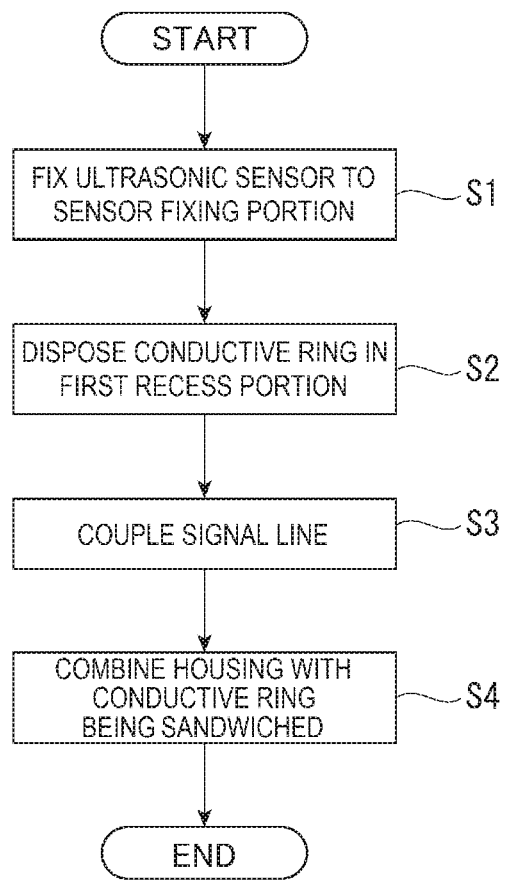
FIG. 6 is a flowchart showing a module assembling step of assembling the ultrasonic module in a manufacturing method of the ultrasonic module according to the first embodiment.

FIG. 6 is a flowchart showing a module assembling step of assembling the ultrasonic module 10 in a manufacturing method of the ultrasonic device 1.

In the module assembling step, the ultrasonic module 10 is assembled by using the wiring member 30 manufactured in steps S1 to S3, the ultrasonic sensor 110, and the housing 120.

Therefore, first, the ultrasonic sensor 110 is fixed to the sensor fixing portion 123 provided in the first housing component 121 (step S1).

Next, the coupling portion 41A of the conductive ring 40 of the wiring member 30 is disposed in the first recess portion 125A of the first housing component 121 (step S2). Then, each signal line 311 is coupled to the connection circuit board 123B (step S3: coupling step).

Then, the first housing component 121, the second housing component 122, and the like are combined to assemble the ultrasonic module 10 (step S4: housing assembling step).

That is, the second recess portion 125B of the second housing component 122 is aligned with a position of the coupling portion 41A, and the second housing component 122 is fixed to a side of the first housing component 121. At this time, by engaging a first engagement member (not shown) of the first housing component 121 with a second engagement member (not shown) of the second housing component 122, the second housing component 122 may be assembled to the first housing component 121. Further, the first housing component 121 and the second housing component 122 may be tightened and fixed by screwing or the like. By fixing the second housing component 122 to the first housing component 121, the conductive ring 40 is held and fixed between the first recess portion 125A and the second recess portion 125B. In addition, since the surfaces of the first recess portion 125A and the second recess portion 125B come into contact with the coupling portion 41A, a metal film at the surface of the conductive ring 40 and the first housing component 121 and the second housing component 122, which are made of a metal, are electrically conducted to each other to have the same potential.

The ultrasonic module 10 is manufactured as described above.

Then, by inserting the male connector 320 of the wiring member 30 into the female connector 221 of the device body 20, the device housing 220 of the device body 20 and the covered wire 312 are electrically conducted. That is, the device housing 220, the covered wire 312, and the housing 120 are electrically conducted, and the circuit board 210, the signal line 311, and the ultrasonic sensor 110 are protected from the electromagnetic waves from the outside.

Effects of Present Embodiment

The ultrasonic device 1 of the present embodiment includes the ultrasonic module 10 in which the ultrasonic sensor 110 is provided, the device body 20 in which the circuit board 210 is provided, and the wiring member 30 coupling the ultrasonic sensor 110 and the circuit board 210.

The wiring member 30 has the signal lines 311 coupled to the ultrasonic sensor 110, and the covered wire 312 that covers the signal lines 311 via the insulating layer 311A. Further, at one end side of the wiring member 30, a conductive ring 40, which is a conductive member into which at least the signal lines 311 are inserted and which is electrically conducted to the covered wire 312, is provided.

Further, the ultrasonic module 10 includes the housing 120 that covers the ultrasonic sensor 110, and the housing 120 includes the first housing component 121 and the second housing component 122 that have conductivity. Then, in the present embodiment, the conductive ring 40 of the wiring member 30 is in contact with and held between the first housing component 121 and the second housing component 122.

That is, in the present embodiment, after the conductive ring 40 of the wiring member 30 is disposed on the first housing component 121, the coupling step of coupling the signal lines 311 to the ultrasonic sensor 110 via the connection circuit board 123B is implemented. Then, the housing assembling step is implemented in which the housing 120 is assembled with the conductive ring 40 held between the first housing component 121 and the second housing component 122.

As a result, the covered wire 312 of the wiring member is coupled to, via the conductive ring 40, the housing 120 configured with the first housing component 121 and the second housing component 122. That is, in order to fix the wiring member 30 to the housing 120, components such as a clamp member and a clamp screw are not required, and with a simple configuration, the wiring member 30 can be fixed to the housing 120 while electrically coupling the covered wire 312 to the housing 120.

In particular, when the ultrasonic module 10 is mounted on an arm portion of a robot, a print head of a printer, or a scan head of a scanner, it is difficult to provide the female connector 221 provided in the device body 20, for example, in the housing 120. Further, in order to fix the cable line 310 with the clamp member or the clamp screw, it is necessary to separately secure a position for mounting the clamp member or the clamp screw, which makes it difficult to downsize the housing 120.

On the contrary, in the present embodiment, the conductive ring 40 only needs to be held between the first housing component 121 and the second housing component 122, so that the conductive ring 40 can be easily incorporated into the small ultrasonic module 10 as described above.

The ultrasonic sensor 110 is configured with a thin and small ultrasonic transducer Tr, and since such an ultrasonic sensor 110 is easily influenced by the electromagnetic waves, it is preferable to cover the ultrasonic sensor 110 with an electromagnetic shield. Here, when a cable line is coupled to a connector or the like, it is conceivable that electromagnetic waves may enter from a slight gap in a portion of the connector. On the contrary, in the present embodiment, the coupling portion 41A of the body portion 41 of the conductive ring 40 comes into contact with the wiring hole 125 over the entire tube outer peripheral surface in a peripheral direction. As a result, in a vicinity of the wiring hole 125, the gap into which the electromagnetic wave enters can be downsized as much as possible, and the influence of the electromagnetic wave can be effectively reduced.

In the present embodiment, the housing 120 is made of a resin, a conductive layer such as the metal film is formed at the surface thereof, and the conductive ring 40 is made of a metal.

In such a configuration, the housing 120 has an elastic force, and when the conductive ring 40 is held and pressed by the first housing component 121 and the second housing component 122, the conductive ring 40 is easily in close contact with the wiring hole 125. As a result, a connection failure between the conductive ring 40 and the wiring hole 125 can be prevented, and electrical resistance can be reduced by increasing a contact area.

Second Embodiment

Next, the second embodiment will be described.

The second embodiment is different from the first embodiment in that the housing 120 has a convex portion with respect to the coupling portion 41A of the conductive ring 40.

In the following description, described items are denoted by the same reference numerals, and the description thereof is omitted or simplified.

Figure 7:
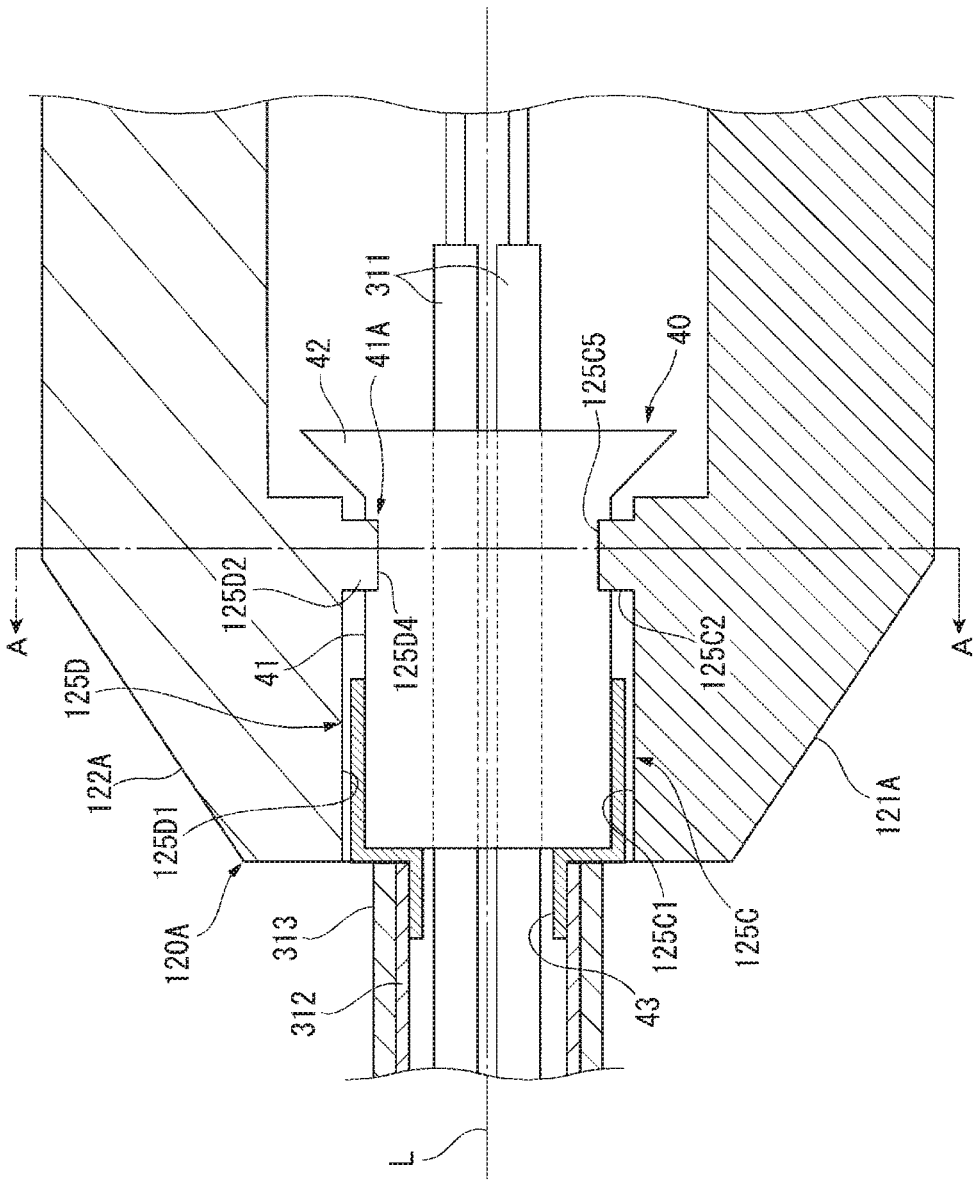
FIG. 7 is a sectional view schematically showing a coupling configuration between a conductive ring and a housing according to a second embodiment.
Figure 8:
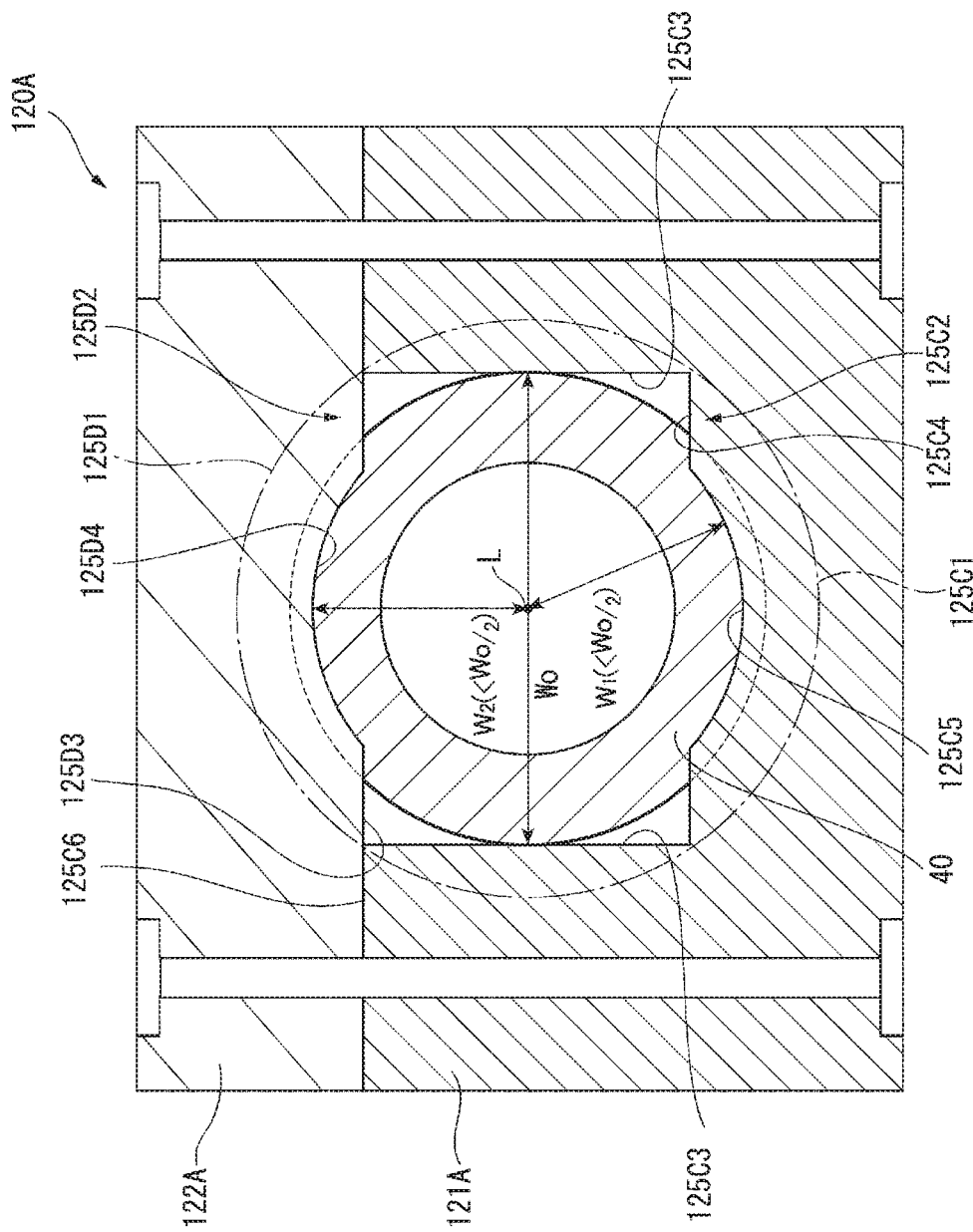
FIG. 8 is a sectional view of an ultrasonic module showing a sectional structure taken along a line A-A in FIG. 7.

FIG. 7 is a sectional view schematically showing a coupling configuration between the conductive ring 40 and a housing 120A according to the second embodiment. FIG. 8 is a sectional view of a sectional structure taken along a line A-A in FIG. 7 in the coupling configuration between the conductive ring 40 and the housing 120A. Note that the signal line 311 is not shown in FIG. 8.

In the present embodiment, the housing 120A has a first housing component 121A, a second housing component 122A, the sensor fixing portion 123, and the window frame portion 124. The first housing component 121A is provided with a first recess portion 125C that holds the conductive ring 40, and the second housing component 122A is provided with a second recess portion 125D that holds the conductive ring 40.

Here, the first recess portion 125C of the present embodiment includes, as shown in FIG. 8, a first introduction portion 125C1 having a diameter dimension larger than a tube outer peripheral diameter dimension $W_0$ of the conductive ring 40, and a first gripping portion 125C2 provided on the window frame portion 124 side of the first introduction portion 125C1. Note that, in FIG. 8, the first introduction portion 125C1 and a second introduction portion 125D1 of the second recess portion 125D described later are indicated by a dashed line.

As shown in FIG. 8, the first gripping portion 125C2 includes a pair of guide surfaces 125C3 that are facing surfaces separated from each other by a dimension approximately same as the tube outer peripheral diameter dimension $W_0$ of the conductive ring 40, and a facing surface 125C4 facing the second housing component 122A and coupling the guide surfaces 125C3 to each other.

Further, the facing surface 125C4 is provided with a first arc surface 125C5 having a cylindrical shape in which a distance $W_1$ from the central axis L is smaller than a half of the tube outer peripheral diameter dimension $W_0$ of the conductive ring 40. That is, the first arc surface 125C5 is a convex portion that protrudes from the first housing component 121A toward the second housing component 122A.

Then, the guide surface 125C3 is provided with a positioning surface 125C6 that faces the second housing component 122A.

On the other hand, the second recess portion 125D of the second housing component 122A includes, as shown in FIG. 7, a second introduction portion 125D1 having a diameter dimension larger than the tube outer peripheral diameter dimension of the conductive ring 40, and a second gripping portion 125D2 provided on the window frame portion 124 side of the second introduction portion 125D1.

As shown in FIG. 8, the second gripping portion 125D2 includes an abutting surface 125D3 that abuts against the positioning surface 125C6. Further, the abutting surface 125D3 is provided with a second arc surface 125D4 having a cylindrical shape in which a distance $W_2$ from the central axis L is smaller than a half of the tube outer peripheral diameter dimension $W_0$ of the conductive ring 40. That is, the second arc surface 125D4 is a convex portion that protrudes from the second housing component 122A toward the first housing component 121A.

In the present embodiment, as shown in FIGS. 7 and 8, when being held between the first arc surface 125C5, which is the convex portion, and the second arc surface 125D4, which is the convex portion, the conductive ring 40 is deformed into a concave shape by pressing. That is, the coupling portion 41A of the body portion 41 of the conductive ring 40 is pressed by the first arc surface 125C5 and the second arc surface 125D4, and the first arc surface 125C5 and the second arc surface 125D4 bite into the coupling portion 41A to be coupled. As a result, the conductive ring 40 is more firmly fixed, and can be more reliably prevented from falling off from the ultrasonic module 10 and the disconnection of the signal line 311 caused thereby.

In the present embodiment, the ultrasonic module 10 can be assembled by a manufacturing method similar to that of the first embodiment.

That is, the wiring member 30 is prepared in advance by a wiring preparation step.

Then, in step S1, the ultrasonic sensor 110 is fixed to the sensor fixing portion 123 of the first housing component 121, the conductive ring 40 is disposed in step S2, and wiring coupling is implemented in step S3. In step S2, a position of the conductive ring 40 can be easily adjusted by disposing the conductive ring 40 along the pair of guide surfaces 125C3 of the first housing component 121A.

Then, in the housing assembling step of step S4, the second housing component 122A is incorporated with respect to the first housing component 121A. At this time, in the present embodiment, the conductive ring 40 is pushed by the abutting surface 125D3 of the second gripping portion 125D2 and the second arc surface 125D4. As a result, as described above, the first arc surface 125C5 and the second arc surface 125D4 deform the coupling portion 41A of the conductive ring 40 by pressing, and the conductive ring 40 and the housing 120A are surely conducted.

In the present embodiment as described above, the same effects as the first embodiment may also be obtained. In addition to this, in the present embodiment, the first housing component 121A constituting the housing 120A includes the first arc surface 125C5 which is a convex portion that protrudes toward the second housing component 122A side, that is, toward the conductive ring 40 disposed on the wiring hole 125. Similarly, the second housing component 122A constituting the housing 120A includes the second arc surface 125D4 which is a convex portion that protrudes toward the first housing component 121A side, that is, toward the wiring hole 125. Then, in the present embodiment, by holding and pressing the conductive ring 40 by the first arc surface 125C5 and the second arc surface 125D4, the conductive ring 40 is fixed by the first arc surface 125C5 and the second arc surface 125D4 biting into and coupling to the conductive ring 40.

Therefore, in the present embodiment, movement of the conductive ring 40 in an axial direction is restricted, so that the conductive ring 40 can be more reliably prevented from falling off from the ultrasonic module 10 and the disconnection of the signal line 311 caused thereby.

The first arc surface 125C5 and the second arc surface 125D4 bite only into a part of the tube outer peripheral surface of the conductive ring 40 along the peripheral direction. Therefore, rotation of the conductive ring 40 is also prevented, and twisting or disconnection of the signal line 311 due to the rotation of the conductive ring 40 can be prevented.

Third Embodiment

Next, the third embodiment will be described.

The second embodiment shows an example in which the first housing component 121A and the second housing component 122A are provided with the first arc surface 125C5 and the second arc surface 125D4, which are convex portions, and the conductive ring 40 is deformed at the position of these convex portions. While the third embodiment is different from the first and second embodiments in that the conductive ring 40 is pressed and deformed by the entire first recess portion 125A and the second recess portion 125B.

Figure 9:
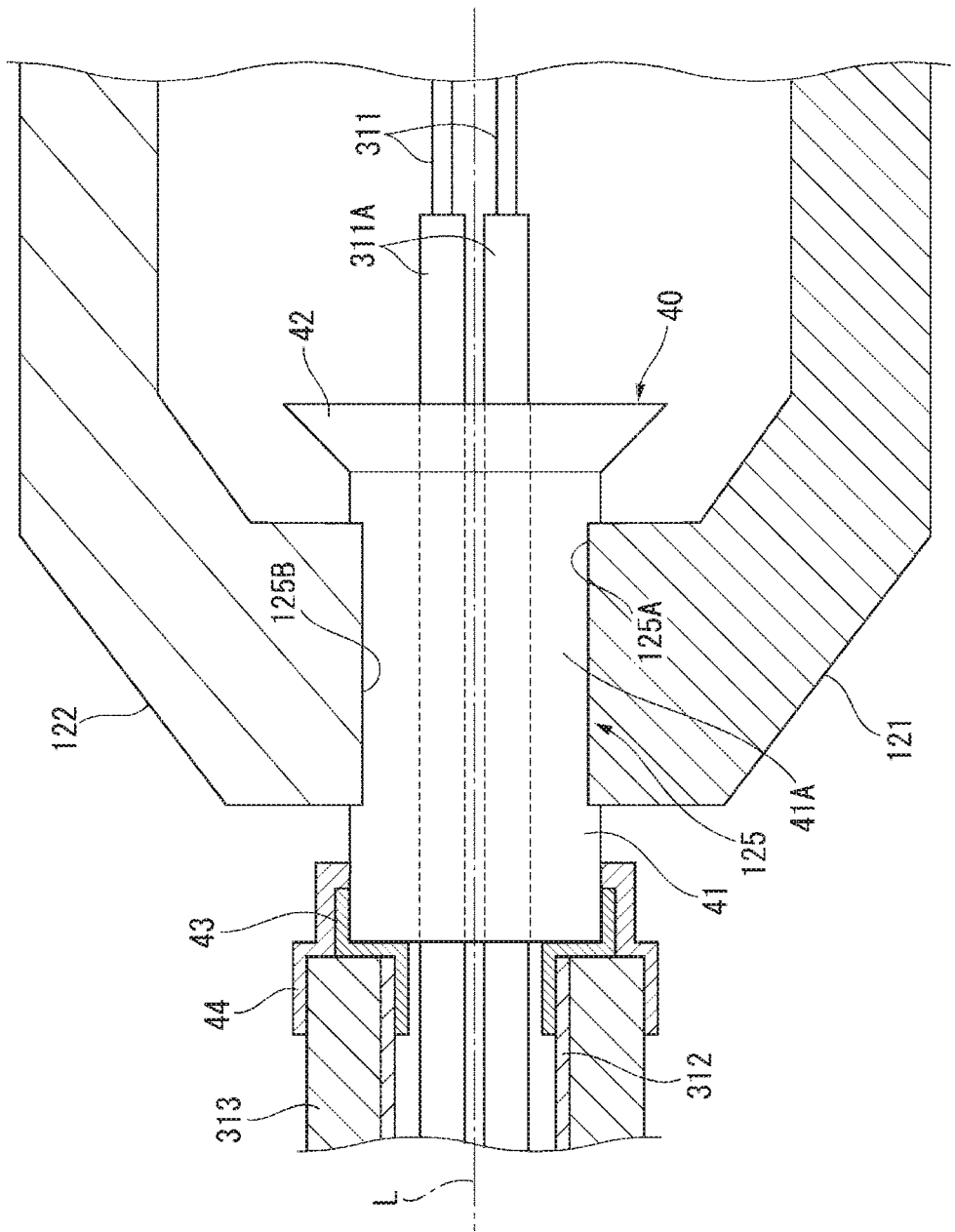
FIG. 9 is a schematic sectional view showing a coupling configuration between a conductive ring and a housing according to a third embodiment.

FIG. 9 is a schematic sectional view showing a coupling configuration between the conductive ring 40 and the housing 120 according to the third embodiment.

In the present embodiment, the housing 120 has the first housing component 121 and the second housing component 122 as in the first embodiment.

On the other hand, in the conductive ring 40 of the present embodiment, the tube outer peripheral diameter dimension of the coupling portion 41A in the body portion 41 is smaller than a tube outer peripheral diameter dimension of a portion other than the coupling portion 41A, and has a groove shape.

Therefore, in the present embodiment, the first recess portion 125A and the second recess portion 125B of the housing 120 are engaged and fixed to the groove-shaped coupling portion 41A of the conductive ring 40.

In the present embodiment, the ultrasonic module 10 can be assembled by a manufacturing method similar to that of the first embodiment.

That is, the wiring member 30 is prepared in advance by step S1 to step S3.

In the conductive ring 40 that is not fixed to the housing 120, the body portion 41 is formed into a cylindrical shape having a diameter dimension same as that of the first embodiment. That is, an initial value of the tube outer peripheral diameter dimension of the coupling portion 41A is the same as that of the tube outer peripheral diameter dimension of the other portions.

Then, in step S1, the ultrasonic sensor 110 is fixed to the sensor fixing portion 123 of the first housing component 121, the conductive ring 40 is disposed in step S2, and then the coupling step is implemented in step S3.

Then, in the housing assembling step of step S4, the second housing component 122 is incorporated with respect to the first housing component 121. At this time, in the present embodiment, the coupling portion 41A of the body portion 41 is held between the first recess portion 125A and the second recess portion 125B and is caulked to be deformed into a recess shape. As a result, the first housing component 121 and the second housing component 122 bite into the coupling portion 41A of the conductive ring 40, so that the conductive ring 40 and the housing 120 are surely conducted.

In the present embodiment, the same effects as the first embodiment may also be obtained. In addition to this, in the conductive ring 40 of the present embodiment, the tube outer peripheral diameter dimension of the coupling portion 41A of the body portion 41 is smaller than the tube outer peripheral diameter dimension of the portion other than the coupling portion 41A of the body portion 41.

That is, in the housing assembling step, the coupling portion 41A of the body portion 41 is elastically deformed by being pressed by the first recess portion 125A and the second recess portion 125B, and the first housing component 121 and the second housing component 122 bite into the conductive ring 40.

As a result, in the present embodiment, similarly to the second embodiment, the movement of the conductive ring 40 in the axial direction is restricted, and the falling off from the ultrasonic module 10 can be prevented.

Fourth Embodiment

Next, the fourth embodiment will be described.

The first embodiment shows an example in which the conductive ring 40 is provided at the end portion of the cable line 310 on the ultrasonic module 10 side, but in the fourth embodiment, the conductive rings 40 are disposed on both end sides of the wiring member.

Figure 10:
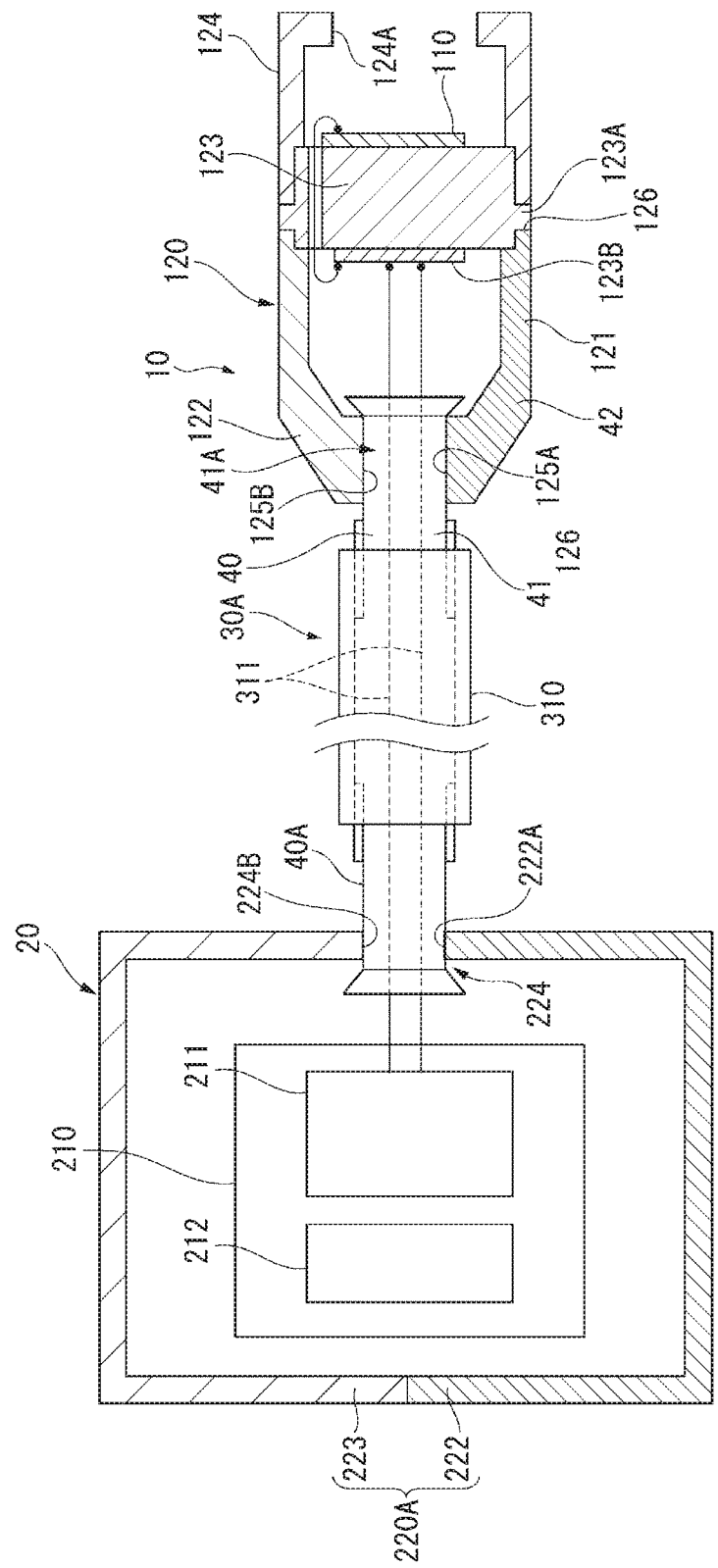
FIG. 10 is a schematic diagram showing a schematic configuration of an ultrasonic device according to a fourth embodiment.

FIG. 10 is a schematic diagram showing a schematic configuration of an ultrasonic device 1A according to the fourth embodiment.

A wiring member 30A of the ultrasonic device 1A shown in FIG. 10 is provided with the conductive ring 40 same as that of the first embodiment on the ultrasonic module 10 side of the cable line 310, and a second conductive ring 40A is provided on the device body 20 side.

Since the second conductive ring 40A has a configuration same as the conductive ring 40, the description thereof is omitted here.

In the present embodiment, the device housing 220A of the device body 20 is configured with a plurality of components, and for example, is formed by combining a first component 222 and a second component 223 as shown in FIG. 10.

Further, the device housing 220A includes a second wiring hole 224 instead of the female connector 221. The second wiring hole 224 is configured with a third recess portion 224A provided in the first component 222 and a fourth recess portion 224B provided in the second component 223, which face each other, and the second conductive ring 40A is held between the third recess portion 224A and the fourth recess portion 224B.

At least one of an inner surface and an outer surface of the device housing 220A, and an inner circumference surface of the second wiring hole 224 have conductivity. For example, the first component 222 and the second component 223 are made of a metal.

The signal line 311 may be directly coupled to the circuit board 210 or may be coupled to the circuit board 210 via a small socket.

Then, in the present embodiment, the second conductive ring 40A is fixed by being held between the third recess portion 224A of the first component 222 and the fourth recess portion 224B of the second component 223 of the device housing 220A. Therefore, similarly to the electrical coupling between the covered wire 312 and the housing 120 via the conductive ring 40 in the first embodiment, the covered wire 312 and the device housing 220A are electrically coupled via the second conductive ring 40A.

In the present embodiment, when the wiring member 30A is coupled to the device body 20, the wiring member 30A can be held between the first component 222 and the second component 223 of the device body 20, so that the device body 20 and the wiring member 30A can be coupled efficiently with a small number of components to simplify the configuration.

Fifth Embodiment

The above-described fourth embodiment shows an example in which the second conductive ring 40A is held and fixed by the third recess portion 224A and the fourth recess portion 224B of the device housing 220A. On the other hand, in the present embodiment, two wiring members are coupled via a coupling connector, and the conductive ring is used in the coupling portion.

Figure 11:
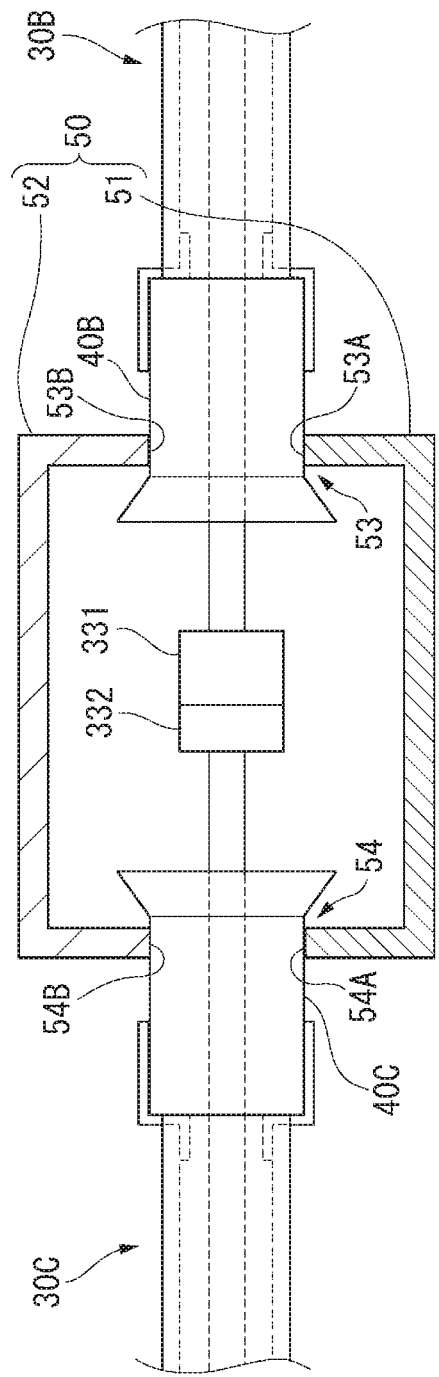
FIG. 11 is a schematic diagram showing a coupling configuration of a wiring member of a fifth embodiment.

FIG. 11 is a diagram showing a schematic configuration of a coupling connector 50 according to the fifth embodiment.

In the present embodiment, the coupling connector 50 couples a first wiring member 30B and a second wiring member 30C, and extends the cable line 310. Although not shown in FIG. 11, the first wiring member 30B is provided with the conductive ring 40 on one end side, and is coupled to the ultrasonic module 10 as in the first embodiment and the like. A third conductive ring 40B is provided on the other end side of the first wiring member 30B.

Although not shown in FIG. 11, one end side of the signal line 311 of the first wiring member 30B is coupled to the ultrasonic sensor 110 via the connection circuit board 123B. The other end side of the signal line of the first wiring member 30B is coupled to the small male socket 331.

Although not shown in FIG. 11, the second wiring member 30C is provided with the second conductive ring 40A on one end side, and is coupled to the device body 20 as in the fourth embodiment and the like. The coupling is not limited to the coupling via the second conductive ring 40A, the male connector 320 may be coupled as in the first embodiment, and the device body 20 may be coupled via the male connector 320.

A fourth conductive ring 40C is provided on the other end side of the second wiring member.

Although not shown in FIG. 11, one end side of the signal line 311 of the second wiring member 30C is coupled to the circuit board 210 of the device body 20. The other end side of the signal line 311 of the second wiring member 30C is coupled to the small female socket 332.

Then, in the present embodiment, the coupling connector 50 couples the first wiring member 30B and the second wiring member 30C.

Specifically, as shown in FIG. 11, the coupling connector 50 includes a first connector component 51 and a second connector component 52, and forms a accommodate space capable of accommodating the male socket 331 and the female socket 332 therein.

Further, the coupling connector 50 includes a first connection wiring hole 53 and a second connection wiring hole 54. The first wiring hole 53 is configured by combining a first connector recess portion 53A provided in the first connector component 51 and a second connector recess portion 53B provided in the second connector component 52 with opening ends thereof facing to each other. Similarly, the second connection wiring hole 54 is configured by combining a third connector recess portion 54A provided in the first connector component 51 and a fourth connector recess portion 54B provided in the second connector component 52 with opening ends thereof facing to each other.

Further, in the coupling connector 50, either an inner surface or an outer surface, and an inner circumference surface of the first connection wiring hole 53 and the second connection wiring hole 54 have conductivity and are coupled to each other.

Then, in order to couple the first wiring member 30B and the second wiring member 30C, firstly, the male socket 331 of the first wiring member 30B and the female socket 332 of the second wiring member 30C are engaged.

Next, the third conductive ring 40B of the first wiring member 30B is disposed in the first connector recess portion 53A of the first connector component 51, and the fourth conductive ring 40C of the second wiring member 30C is disposed in the third connector recess portion 54A.

Then, the first connector component 51 is covered with the second connector component 52 and pressed and fixed by screwing or the like. Thereby, the third conductive ring 40B is held by the first connector recess portion 53A and the second connector recess portion 53B, and an outer peripheral surface of the third conductive ring 40B comes into contact with an inner circumference surface of the first connection wiring hole 53, so as to be electrically coupled. Similarly, the fourth conductive ring 40C is held between the third connector recess portion 54A and the fourth connector recess portion 54B, and an outer peripheral surface of the fourth conductive ring 40C comes into contact with an inner circumference surface of the second connection wiring hole 54, so as to be electrically coupled.

Therefore, the covered wire 312 of the first wiring member 30B is electrically conducted to the covered wire of the second wiring member 30C via the third conductive ring 40B, the coupling connector 50, and the fourth conductive ring 40C. Further, the male socket 331 and the female socket 332 are accommodated in the coupling connector 50 maintained at the ground potential, so that the influence of the electromagnetic waves from the outside can be prevented.

Modifications

It should be noted that the disclosure is not limited to the above-described embodiments, and modifications, improvements, and the like within the scope of achieving the object of the disclosure are included in the disclosure.

First Modification

The above embodiments show an example in which the conductive ring 40 and the covered wire 312 are coupled such that, one end portion of the conductive tape 43 is inserted between the covered wire 312 and the signal line 311, and the other end portion of the conductive tape 43 couples to the outer peripheral surface of the conductive ring 40. However, the coupling between the conductive ring 40 and the covered wire 312 is not limited thereto.

For example, the signal line 311, the covered wire 312, and the exterior portion 313 of the cable line 310 may be inserted into the conductive ring 40, and in the housing 120, the covered wire 312 and the conductive ring 40 may be coupled by using a lead wire or the like, or may be directly coupled by soldering or the like.

Further, when the conductive ring 40 is made of a metal ring, for example, when the conductive ring 40 has conductivity from the tube outer peripheral surface to the tube inner peripheral surface, a part of the exterior portion 313 of the cable line 310 may be removed to expose the covered wire 312, and the exposed covered wire 312 may be abutted against the tube inner peripheral surface of the conductive ring 40. Further, the exposed covered wire 312 may be covered and coupled to the outer peripheral surface of the conductive ring 40.

Second Modification

The second embodiment shows an example in which the first gripping portion 125C2 and the second gripping portion 125D2 are provided in the first recess portion 125C and the second recess portion 125D of the housing 120A, and the first gripping portion 125C2 and the second gripping portion 125D2 are provided with the first arc surface 125C5 and the second arc surface 125D4, which are convex portions, but the disclosure is not limited to this. For example, as in the first embodiment, the first recess portion 125A or the second recess portion 125B having an inner surface in a semi-cylindrical shape may be provided with a convex portion that protrudes toward the conductive ring 40.

The convex portion may have an arc shape such that a distance from the central axis L is a predetermined distance, like the first arc surface 125C5 and the second arc surface 125D4, and may have a cone shape, a needle shape, a hemisphere shape, or the like in which a protruding tip end is a vertex. A plurality of these convex portions may be provided along the peripheral direction on tube inner peripheral surfaces of the first recess portion 125A and the second recess portion 125B, or may be provided along a line parallel to the central axis L, or may be randomly disposed.

Even in such a case, the convex portion bites into the conductive ring 40, so that the movement or rotation of the conductive ring 40 can be restricted. In addition, a contact area between the conductive ring 40 and the housing 120 can be increased, and the electrical resistance can be reduced by providing a plurality of relatively small convex portions as described above in the first recess portion 125A and the second recess portion 125B of the first embodiment.

Third Modification

In the second embodiment, the configuration in which the convex portion is provided in the housing 120A is shown, but the disclosure is not limited to this. For example, the outer peripheral surface of the conductive ring 40 may be provided with a convex portion that protrudes in a brim shape in the peripheral direction, or may be partially provided with a circular arc-shaped convex portion in the peripheral direction.

Further, as in the second modification, a plurality of convex portions may protrude toward the housing 120 on the outer peripheral surface of the conductive ring 40.

In this way, when a convex portion is provided on the outer peripheral surface of the conductive ring 40, and when the conductive ring 40 is held by the first recess portion 125A and the second recess portion 125B, the convex portion bites into the housing 120 side to elastically deform the housing 120. As a result, similarly to the second embodiment, the rotation and falling off of the conductive ring 40 can be prevented.

When the convex portion is provided on the conductive ring 40, the conductive ring 40 is made of a metal, and the housing 120 is made of a resin having a conductive film material formed on an upper surface thereof, it is preferable that the housing 120 has a hardness lower than that of the conductive ring 40 and is made of a material that is easily elastically deformed.

Further, the convex portion may be formed of a material having a high hardness, and the conductive ring 40 and the housing 120 may be formed of a material having a low hardness and easily elastically deformed. In this case, both the conductive ring 40 and the housing 120 may be provided with a convex portion.

Fourth Modification

In the coupling between the device body 20 and the second conductive ring 40A in the fourth embodiment, and the coupling between the coupling connector 50 and the third conductive ring 40B and the fourth conductive ring 40C in the fifth embodiment, as in the first embodiment, a configuration is adopted in which the outer peripheral surface of the conductive ring 40 abuts against the inner peripheral surface of the wiring hole 125. On the other hand, as in the second embodiment, at least one of the device body 20, the coupling connector 50, and the conductive rings 40A, 40B, 40C may be provided with a convex portion. In addition, as in the third embodiment, the conductive ring 40 may be tightened and deformed by the third recess portion 224A and the fourth recess portion 224B of the device body 20, the first connector recess portion 53A and the second connector recess portion 53B of the coupling connector 50, as well as the third connector recess portion 54A and the fourth connector recess portion 54B.

Fifth Modification

In the above embodiments, the conductive ring 40 having an annular cross section is shown, but the disclosure is not limited thereto. The conductive ring 40 may be formed in a tube shape whose outer shape of a cross section orthogonal to the central axis is rectangular or triangular. In this case, a shape of the wiring hole 125 may be a shape corresponding to the outer shape of the conductive ring 40.

Figure 12:
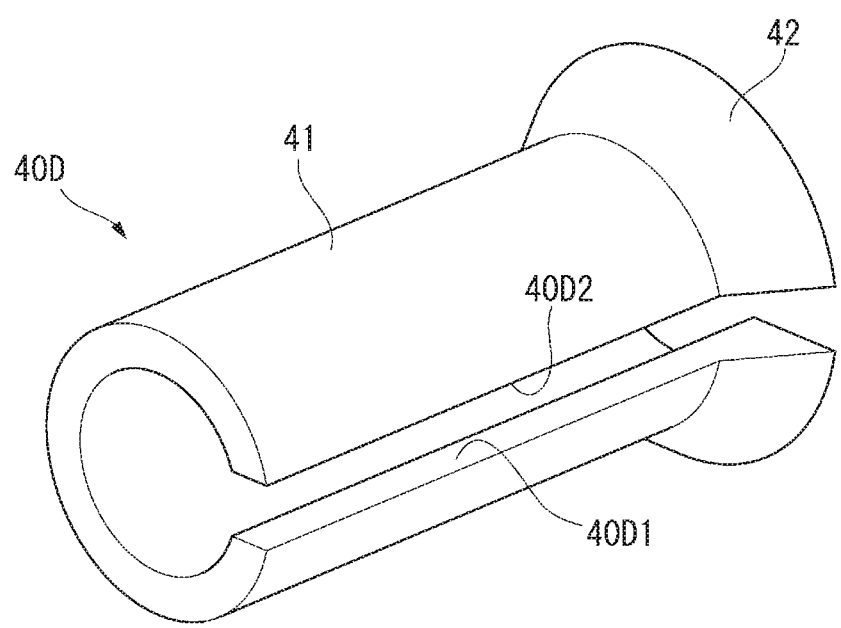
FIG. 12 is a perspective view of a conductive ring according to a fifth modification.

Further, as shown in FIG. 12, a conductive ring 40D may be formed in an arc shaped cross section, and may have a shape having facing surfaces 40D1, 40D2 that face to each other. In this case, the conductive ring 40 is disposed such that a direction from the first housing component 121 toward the second housing component 122 and a direction from the facing surface 40D1 toward the facing surface 40D2 coincide with each other. As a result, when the conductive ring 40D is held and pressed between the first housing component 121 and the second housing component 122, the conductive ring 40D elastically deforms in a direction in which the facing surfaces 40D1, 40D2 are close to each other. Therefore, the outer peripheral surface of the conductive ring 40D is pressed against the first housing component 121 and the second housing component 122 by a reaction force thereof, and the conductive ring 40D and the housing 120 can be in close contact with each other to reduce the electrical resistance.

Sixth Modification

Figure 13:
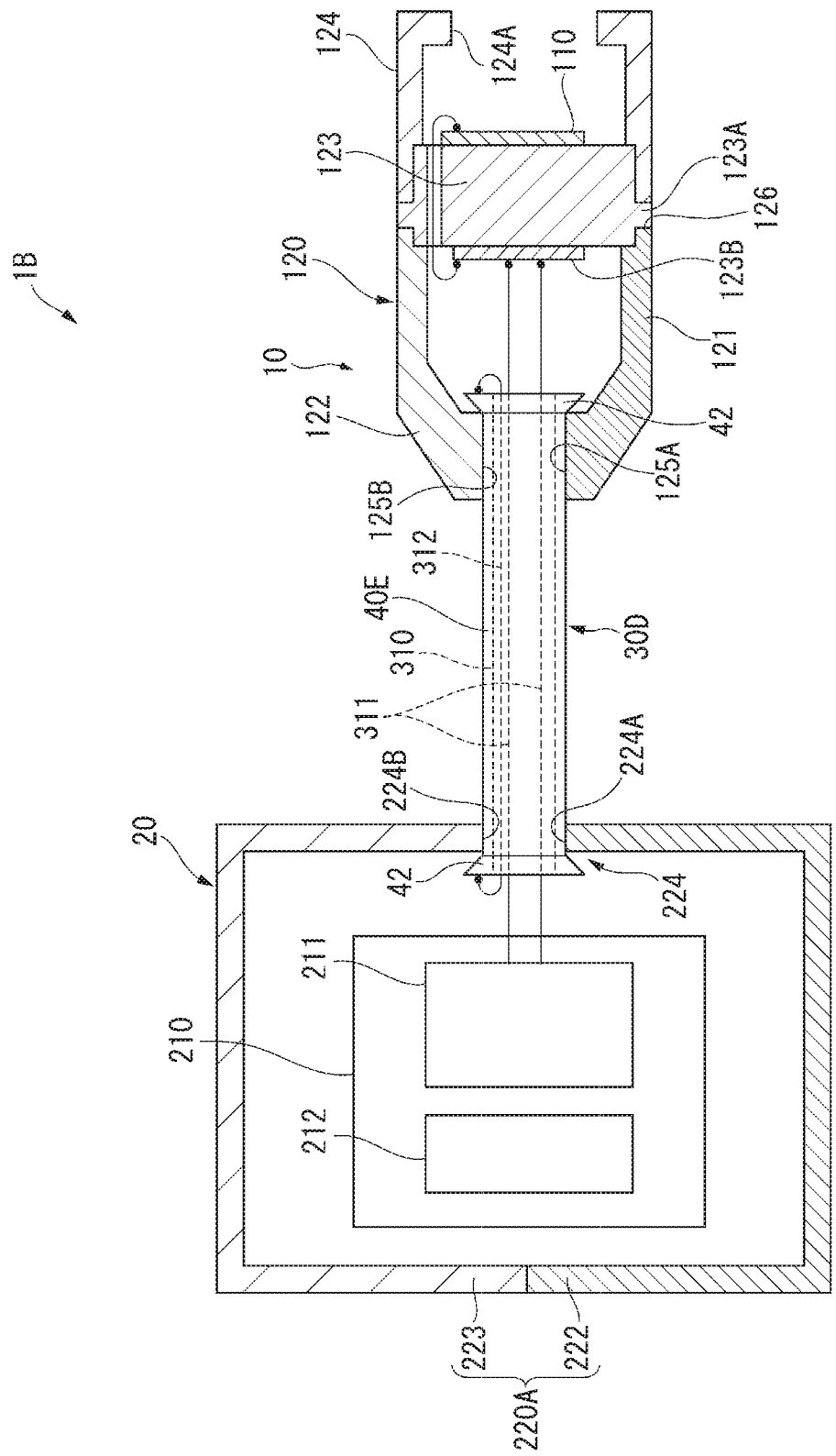
FIG. 13 is a diagram showing a schematic configuration of an ultrasonic device according to a sixth modification.

FIG. 13 is a diagram showing a schematic configuration of an ultrasonic device 1B according to the sixth modification.

In the first embodiment, the wiring member 30 includes the cable line 310, and the conductive ring 40 provided on one end side of the cable line 310. Accordingly, in a wiring member 30D shown in FIG. 13, a conductive ring 40E may be formed from the ultrasonic module 10 to the device body 20, and the cable line 310 may be inserted into the conductive ring 40E.

Seventh Modification

In the conductive ring 40, the configuration in which the large diameter portion 42 is provided at one end in the axial direction is shown, but the large diameter portion 42 may be provided at both ends. In this case, a dimension of the body portion 41 between the large diameter portions 42 may be a width dimension along the central axis L of the wiring hole 125, and the wiring hole 125 may be held by a pair of large diameter portions 42. As a result, the conductive ring 40 can be positioned at the predetermined position, and a position shift of the conductive ring 40 in the housing assembling step can be prevented.

Eighth Modification

The first embodiment shows an example in which the housing 120 is made of a resin, a conductive layer such as the metal film is formed on the surface thereof, and the conductive ring 40 is made of a metal, but the disclosure is not limited to this.

The conductive ring 40 may be made of a resin, a conductive layer such as the metal film may be formed on the surface thereof, and the housing 120 may be made of a metal.

Further, both the conductive ring 40 and the housing 120 may be made of a metal, or may be made of a resin with a conductive layer formed on surfaces thereof.

The same applies to the device housing 220A and the coupling connector 50 of the fourth embodiment.

What is claimed is:

1. An ultrasonic device comprising:
   an ultrasonic sensor;
   a wiring member; and
   a housing, wherein
   the wiring member includes:
     a signal line,
     a covered wire that covers the signal line coupled to the ultrasonic sensor via an insulating layer, and
     a conductive ring that is electrically coupled with the covered wire,
   the signal line is inserted into the conductive ring,
   the signal line is inserted into the housing through the conductive ring,
   the housing covers the ultrasonic sensor and has a plurality of housing components having conductivity, and
   the conductive ring is electrically coupled to and held by the plurality of housing components.

2. The ultrasonic device according to claim 1, wherein
   a first housing component of the plurality of housing components includes a convex portion that protrudes towards a second housing component of the plurality of housing components and the conductive ring, and
   the convex portion is coupled to the second housing component and the conductive ring.

3. The ultrasonic device according to claim 1, wherein
   at least one of the plurality of housing components and the conductive ring are made of a metal at a coupling portion between the housing and the conductive ring.

4. The ultrasonic device according to claim 1, wherein
   the conductive ring has a tubular shape with a central axis, and
   an outer peripheral diameter of the conductive ring at a coupling portion between the housing and the conductive ring is smaller than an outer peripheral diameter of the conductive ring at a portion other than the coupling portion.

* * * * *